United States Patent
Li et al.

(10) Patent No.: US 11,037,838 B2
(45) Date of Patent: Jun. 15, 2021

(54) IN-SITU INTEGRATED CHAMBERS

(71) Applicant: Applied Materials, Inc., Santa Clara, CA (US)

(72) Inventors: Xuebin Li, Sunnyvale, CA (US); Schubert S. Chu, San Francisco, CA (US); Errol Antonio C. Sanchez, Tracy, CA (US); Patricia M. Liu, Saratoga, CA (US); Gaurav Thareja, Santa Clara, CA (US); Raymond Hoiman Hung, Palo Alto, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/559,227

(22) Filed: Sep. 3, 2019

(65) Prior Publication Data

US 2020/0091010 A1    Mar. 19, 2020

Related U.S. Application Data

(60) Provisional application No. 62/732,961, filed on Sep. 18, 2018.

(51) Int. Cl.
| | |
|---|---|
| *H01L 21/8238* | (2006.01) |
| *H01L 21/321* | (2006.01) |
| *H01L 21/02* | (2006.01) |
| *H01L 29/66* | (2006.01) |

(52) U.S. Cl.
CPC .. *H01L 21/823814* (2013.01); *H01L 21/0206* (2013.01); *H01L 21/02043* (2013.01); *H01L 21/02068* (2013.01); *H01L 21/321* (2013.01); *H01L 29/665* (2013.01)

(58) Field of Classification Search
None
See application file for complete search history.

(56) References Cited

U.S. PATENT DOCUMENTS

| | | | |
|---|---|---|---|
| 4,414,057 A | 11/1983 | Bourassa et al. | |
| 4,785,962 A | 11/1988 | Toshima | |
| 5,976,976 A | 11/1999 | Doan et al. | |

(Continued)

FOREIGN PATENT DOCUMENTS

WO     03007349 A2    1/2003

OTHER PUBLICATIONS

International Search Report and Written Opinion dated Jan. 13, 2020 for Application No. PCT/US2019/049334.

(Continued)

*Primary Examiner* — Asok K Sarkar
(74) *Attorney, Agent, or Firm* — Patterson + Sheridan LLP

(57) ABSTRACT

The systems and methods discussed herein are for a cluster tool that can be used for MOSFET device fabrication, including NMOS and PMOS devices. The cluster tool includes process chambers for pre-cleaning, metal-silicide or metal-germanide film formation, and surface protection operations such as capping and nitridation. The cluster tool can include one or more process chambers configured to form a source and a drain. The devices fabricated in the cluster tool are fabricated to have at least one protective layer formed over the metal-silicide or metal-germanide film to protect the film from contamination during handling and transfer to separate systems.

20 Claims, 2 Drawing Sheets

(56) References Cited

U.S. PATENT DOCUMENTS

| | | | |
|---|---|---|---|
| 6,130,145 | A | 10/2000 | Ilg et al. |
| 6,194,315 | B1 | 2/2001 | Hu et al. |
| 6,257,827 | B1 | 7/2001 | Hendrickson et al. |
| 7,402,207 | B1 | 7/2008 | Besser et al. |
| 7,732,269 | B2 | 6/2010 | Kim et al. |
| 7,867,789 | B2 | 1/2011 | Lu et al. |
| 7,960,236 | B2 | 6/2011 | Chopra et al. |
| 9,059,024 | B2 | 6/2015 | Glass et al. |
| 9,853,129 | B2 | 12/2017 | Bauer et al. |
| 9,893,189 | B2 | 2/2018 | Colinge et al. |
| 2010/0276761 | A1 | 11/2010 | Tung et al. |
| 2014/0001520 | A1 | 1/2014 | Glass et al. |
| 2014/0008812 | A1 | 1/2014 | Emesh |
| 2014/0065819 | A1 | 3/2014 | Ahmed et al. |
| 2015/0044842 | A1 | 2/2015 | Wang et al. |
| 2016/0020301 | A1 | 1/2016 | Park et al. |
| 2016/0190008 | A1* | 6/2016 | Chandrashekar ............ H01L 21/76874 438/627 |
| 2016/0329431 | A1 | 11/2016 | Glass et al. |
| 2017/0213750 | A1 | 7/2017 | Khaja et al. |
| 2017/0352762 | A1 | 12/2017 | Yang et al. |
| 2018/0076065 | A1 | 3/2018 | Bao et al. |
| 2018/0145140 | A1 | 5/2018 | Lin et al. |
| 2018/0166575 | A1 | 6/2018 | Colinge et al. |
| 2018/0174913 | A1 | 6/2018 | More et al. |

OTHER PUBLICATIONS

Taiwan Office Action dated Sep. 7, 2020 for Application No. 108132554.

Taiwan Office Action dated Feb. 22, 2021 for Application No. 108132554.

* cited by examiner

IN-SITU INTEGRATED CHAMBERS

CROSS-REFERENCE TO RELATED APPLICATIONS

This application claims priority to U.S. Provisional Patent Application Ser. No. 62/732,961, filed on Sep. 18, 2018, which herein is incorporated by reference.

BACKGROUND

Field

Aspects of the present disclosure generally relate to the fabrication of field-effect transistors (FETs).

Description of the Related Art

Field-effect transistors are a family of transistors that rely on an electric field created by the voltage on the gate in order to control the current flow between the drain and the source. One of the many types of FETs is the metal-oxide semiconductor FET (MOSFET). The fabrication of MOSFET devices includes multiple deposition and patterning operations that are executed to form and electrically connect and/or isolate various features of the device. At least one silicide layer is typically formed during the MOSFET fabrication process. Nucleation of the silicide layer, which can be a metal-silicide including a polycrystalline ("poly") metal-silicide, can be challenging in light of the numerous process operations involved in MOSFET fabrication. Typically the silicide layer formation is not in-situ integrated with transistor source and drain film formation. Subsequent to the transistor source/drain epitaxial film formation, the source/contact region is protected with a hardmask (such as nitride film) during the following transistor gate formation. Subsequent to gate formation, the source/drain top contact region is opened by etching away hardmask for the silicide film formation on top of source and drain contact region. The etching treatment on hardmask removal will also etch away some amount of source/drain film on top and damage the contact surface, which is not favorable for low contact resistance requirement. The grown metal silicide layer is easily oxidized in air without surface treatment (such as nitridation) or capping with other films (such as titanium nitride, silicon nitride). In-situ process and hardware integration of source/drain film formation, silicide layer formation and surface protection would facilitate to minimizing or reducing transistor contact resistance between source/drain top layer and silicide layer.

Thus, there remains a need in the art for an improved system and method of MOSFET fabrication.

SUMMARY

In one implementation, a computer-readable medium includes instructions that are configured to cause a system to: transfer a substrate from a transfer chamber into a pre-clean process chamber for a pre-clean operation, and execute the pre-clean operation in the pre-clean process chamber. Subsequent to the pre-clean operation, the instructions are configured to transfer the substrate from the pre-clean process chamber into a source/drain epitaxial deposition process chamber, and form a source and a drain on the substrate in the source/drain epitaxial deposition process chamber. The instructions are configured to, subsequent to the formation of the source and the drain in the source/drain epitaxial deposition process chamber, transfer the substrate from the source/drain epitaxial deposition process chamber into a film formation process chamber to form a metal-silicide film or a metal-germanide on the source and the drain, and form the metal-silicide film or the metal-germanide on the source and the drain in the film formation process chamber. The instructions are configured to, subsequent to the formation of the source and the drain, transfer the substrate from the film formation process chamber into a surface protection process chamber; and perform a surface protection operation in the surface protection process chamber.

In one implementation, a method of processing a substrate includes transferring, using a central transfer robot disposed in a transfer volume of a transfer chamber, a substrate into a first process chamber of a plurality of process chambers configured to perform at least one pre-clean operation; performing the at least one pre-clean operation in the first process chamber; subsequent to the at least one pre-clean operation, transferring the substrate from the first process chamber, through the transfer volume of the transfer chamber, and into a second process chamber of the plurality of process chambers, the second process chamber being configured to form a source and a drain on the substrate; and forming the source and the drain on the substrate in the second process chamber of the plurality of process chambers. The method also includes, subsequent to the formation of the source and the drain, transferring the substrate from the second process chamber, through the transfer volume of the transfer chamber, and into a third process chamber of the plurality of process chambers, the third process chamber being configured to form a film on the source and the drain; and forming the film on the source and the drain in the third process chamber. The method also includes, subsequent to the formation of the source and the drain, transferring the substrate from the third process chamber, through the transfer volume of the transfer chamber, and into a fourth process chamber of the plurality of process chambers, the fourth process chamber being configured to form a protective film on the source and the drain; and forming the protective film on the source and the drain in the fourth process chamber.

In one implementation, a system includes a plurality of process chambers, and a first process chamber of the plurality of process chambers is configured for pre-cleaning operations, a second process chamber of the plurality of process chambers is configured for epitaxial deposition operations, and a third process chamber of the plurality of process chambers is configured to perform at least one of a capping layer formation operation or execute a nitridation operation; a transfer chamber coupled to each process chamber of the plurality of process chambers; a central transfer robot configured to transfer a substrate among and between the transfer chamber and one or more of the plurality of process chambers; and a controller configured to execute a plurality of instructions including which process chambers of the plurality of process chambers the substrate is transferred to, operations executed in the process chambers of the plurality of process chambers when the substrate is transferred, and an order in which the substrate is transferred to the process chambers.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The systems and methods discussed herein are directed towards the fabrication of MOSFET devices in a cluster tool that includes a plurality of integrated process chambers. Each operation can be executed in a single chamber configured to execute one or more operations or can be executed in a plurality of process chambers, each of which is configured to execute one or more operations. The operations executed in process chambers of the cluster tools discussed herein can include pre-cleaning, source/drain deposition, metal-silicide or metal germanide film formation, and surface protection using capping or nitridation of a substrate. The substrates, which can include one or more layers of material, are transferred among and between process chambers of the cluster tool using a central transfer robot. The central transfer robot is disposed in an environmentally controlled transfer space that can be configured for pressure and/or temperature control. In contrast, during conventional MOSFET device fabrication, the substrate is transferred between various systems (e.g., cluster tools) for different operations including film formation. The transfer of the substrate between systems can expose the substrate to ambient air and/or contaminants that can negatively impact downstream fabrication operations and MOSFET device performance. However, using the systems and the methods of MOSFET fabrication discussed herein, multiple operations are executed in process chambers that are part of a single cluster tool, which minimizes the exposure of the substrate to undesirable process environments.

The operations discussed herein can include two or more chambers on the same cluster tool configured to execute similar operations, for example, pre-cleaning, source/drain deposition, metal-silicide film or metal-germanide film formation, or surface protection operations. One or more process chambers can be used to execute each of the pre-cleaning, source/drain ("s/d") deposition, film formation, and/or surface protection operations. The execution of multiple, sequential, MOSFET fabrication operations in the cluster tool minimizes the transfer of the substrate between other cluster tools, minimizing exposure to an ambient environment. Reduced handling of the substrate among and between different cluster tools reduces the likelihood and/or magnitude of contamination of the substrate. Using the systems and methods discussed herein, the quality of the contacts formed during MOSFET fabrication is improved because of the fabrication of the film and surface protection layer(s) in the cluster tool as discussed herein which occur in the same cluster tool as other MOSFET fabrication processes.

Figure 1:
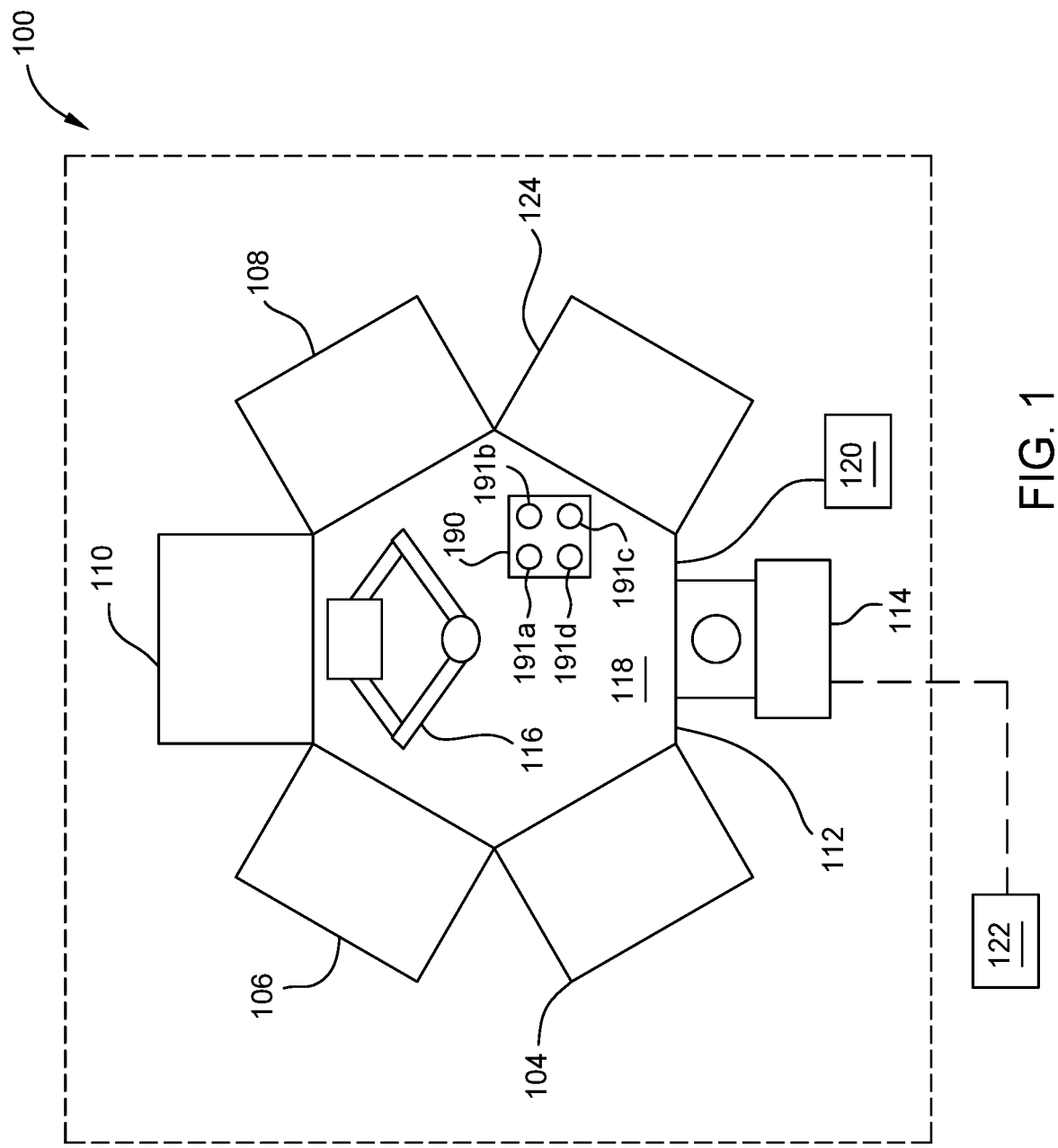
FIG. 1 is a schematic illustration of a system for forming semiconductor components, according to one implementation of the present disclosure.

FIG. 1 is a schematic plan view of a system 100 for forming MOSFET devices, according to one implementation of the present disclosure. The system 100 is a cluster tool having one or more process chambers. The system 100 is configured to perform one or more MOSFET fabrication operations. In one example, the system 100 includes a plurality of process chambers 104, 106, 108, 110, and 124 (five are shown), as well as a transfer chamber 112. A central transfer robot 116 is disposed in a transfer volume 118 of the transfer chamber 112. The plurality of process chambers 104, 106, 108, 110, and 124 can be arranged in various positions around the transfer chamber 112 and can be configured to perform various MOSFET fabrication operations. While process chambers 104, 106, 108, 110, and 124 are illustrated, it is contemplated that the system 100 may include more or less than five process chambers disposed about the transfer chamber 112. The system 100 discussed herein is configured to perform MOSFET fabrication operations including some or all of: (A) pre-cleaning a substrate, (B) epitaxial deposition of a source and a drain for NMOS or PMOS devices, (C) metal-silicide film or metal-germanide film formation on the source and drain, and (D) surface treatment/protection after film formation.

The system 100 can be communicatively, electrically, mechanically, or otherwise coupled to one or more additional systems, such as other cluster tools, shown collectively as the second system 122 in FIG. 1. The second system 122 can be used for various operations including film formation, patterning, and/or thermal annealing that can occur before and/or after the execution of one or more operations in the system 100. In one example, the source and the drain of a MOSFET device are formed prior to the substrate entering the system 100. In another example, the source and the drain are formed as discussed below using the system 100.

Substrates are transferred to and from the system 100 to the system 122 using a transfer system and can be exposed to ambient air, handling damage, and/or other contamination or undesirable conditions. In one example, substrates can be transferred from the second system 122 into a factory interface 114 of the system 100. From the factory interface 114, substrates can be transferred to the transfer chamber 112. The transfer volume 118 of the transfer chamber 112 can be an environmentally-controlled environment, such as an environment where the temperature and/or pressure can be set and maintained and/or adjusted. In one example, the transfer chamber 112 is held under vacuum pressure and at a temperature from about 25° C. to about 150° C. during MOSFET fabrication. The central transfer robot 116 is configured to transfer substrates among and between the process chambers 104, 106, 108, 110, and 124.

As discussed herein, the system 100 may include more or less process chambers than the process chambers 104, 106, 108, 110, and 124 shown in FIG. 1. Each process chamber 104, 106, 108, 110, and 124 can be configured to perform one or more operations. It is contemplated that the system 100 may include duplicative chambers. For example, the system 100 may include a plurality of pre-clean chambers configured to perform the same or different pre-clean operations. Likewise, the system 100 may include a plurality of deposition chambers configured to perform the same or different deposition processes.

In one example, a controller 120 is communicatively coupled to the system 100 and configured to execute a plurality of instructions that include an order of operations executed to form all or part of a MOSFET device. The order of operations can include which process chambers 104, 106, 108, 110, and 124 the substrate is to be transferred to, which operations are to be performed in the process chamber(s), and/or an order in which the transfer and/or execution of operations occur. The order of operations can further include additional MOSFET fabrication process details including chamber parameters such as pressure, temperature, precursor type(s), gas flow rate, plasma generation parameters, and/or other parameters that can be used to fabricate various types of MOSFET devices as discussed herein.

The system 100 is configured to execute one or more cleaning operations in a pre-clean process chamber 108. While only a single pre-clean process chamber 108 is shown in FIG. 1, it is contemplated that the system 100 may include a plurality of pre-clean process chambers 108. Pre-cleaning prepares the substrate for subsequent operations such as film formation to improve the quality of the films formed on the cleaned substrate. Each pre-clean process chamber 108 is configured to prepare the substrate for subsequent operations by removing one or more of native oxides or residual carbon, and/or by remedying surface defects including defects of previously deposited and/or patterned films. The native oxides can form due to handling after upstream operations, and the residual carbon can be a result of hardmasks used in upstream operations. In an embodiment, which can be combined with other embodiments, the system 100 includes one or more source/drain epitaxial deposition process chambers ("s/d chambers"), two (104, 106) of which are shown. In one example, the s/d chamber 104 is configured for PMOS formation while the s/d chamber 106 is configured for NMOS formation. In such an example, the s/d chamber 104 is configured to form p-type MOSFET devices, while the s/d chamber 106 is configured to form n-type MOSFET devices. In one example, the s/d chambers 104, 106 may be omitted from the system 100. In such an example, the substrates provided to the system 100 already include the source and the drain formed thereon.

In an embodiment, which can be combined with other embodiments, the system 100 includes a film formation process chamber 110. While only a single film formation process chamber 110 is shown, it is contemplated that the system 100 can include a plurality of film formation process chambers 110. In an example where the film formation operation includes one or more film formation process chambers 110, each film formation process chamber 110 can be configured to form one or more of a metal-silicide film and/or a metal-germanide film on the source and the drain. The one or more film formation process chambers 110 can include a chemical vapor deposition (CVD) chamber or an atomic layer deposition (ALD) chamber.

The system 100 includes a surface protection process chamber 124. While only a single surface protection process chamber 124 is shown, it is contemplated that the system 100 may include a plurality of surface protection process chambers 124 configured to perform a capping operation and/or a nitridation operation. Capping is an operation that forms a layer over a substrate surface, such as the source and the drain of a MOSFET device. In one example, the layer can be formed from titanium (Ti), titanium nitride (TiN), silicon nitride, and/or silicon (Si). In one example, the surface protection process chamber 124 is configured to perform a nitriding operation. Nitriding (nitridation) exposes at least a portion of a substrate, such as the source and the drain of the substrate, to a nitrogen source after the metal-silicide film or metal-germanide film is deposited. The exposure to nitrogen source forms a hardened protective surface layer over the metal-silicide film or metal-germanide film. The protective layer(s) formed during nitridation prevent or reduce oxidation of the metal-silicide film or metal-germanide film once the structure formed in the cluster tool is transferred to a different tool for further processing. In one example, the surface protection layer formed by the surface protection process chamber 124 is an interface layer to promote downstream operations including the formation and/or patterning of one or more target layers.

As discussed above, the system 100 includes one or more pre-clean process chambers 108 (one is shown). In one example, the one or more pre-clean process chambers 108 include one or more of: a first pre-clean process chamber configured for native oxide removal operations, a second pre-clean process chamber that is configured to generate hydrogen ($H_2$) plasma to remove residual carbon, and a third pre-clean process chamber. In one example, the third pre-clean process chamber is configured to generate chlorine (Cl) plasma to remove thin defective layers, including epitaxial layers, from the substrate. Additionally or alternatively, in one of the pre-clean chambers 108, residual carbon is removed. Residual carbon can be left on the substrate from previous film formation and patterning operations that can include the use of a hardmask layer that incorporates carbon.

In one example, the NMOS chamber 106 is configured to form an n-type source and an n-type drain and the PMOS chamber 104 is configured to form a p-type source and a p-type drain. The NMOS chamber 106 is connected to one or more precursor sources including silicon (Si) phosphorous (P), arsenic (As), antimony (Sb), bismuth (Bi), and/or lithium (Li). The PMOS chamber 104 is connected to one or more precursor sources such as boron (B), gallium (Ga), tin (Sn), indium (In), germanium (Ge), and/or silicon (Si).

The film formation process chamber 110 is configured to form a metal-silicide film or a metal-germanide film on the source and the drain. As discussed above, while a single film formation process chamber 110 is shown, it is contemplated that the system 100 may include a plurality of film formation process chambers 110. In one example, the film formation process chambers 110 include one or more of: a first film formation process chamber configured as a CVD chamber to form metal-silicide films on the source and the drain using lamp-heat or a resistive heater(s), and/or a second film formation process chamber configured as a CVD chamber to form metal-germanide film using lamp-heat or a resistive heater(s). The film formation process chamber(s) 110 can additionally or alternately include a third film formation process chamber configured to form either or both of metal-silicide and/or metal-germanide films. In one example, the film formation process chambers 110 are lamp heated and configured to form metal-silicide or metal-germanide films. In one example, the film formation process chambers 110 are resistively heated, for example, using a heated substrate support, and configured to form metal-silicide or metal-germanide films. The NMOS chamber 106 and/or the PMOS chamber 104 are used to form metal-silicide or metal-germanide films and can be lamp-heated.

The system 100 includes the surface protection process chamber 124. The surface protection operation(s) are employed to prevent oxidation of the metal-silicide film or metal-germanide film when being exposed to air, for example, when the MOSFET structure is transferred to a second system 122. While a single surface protection process chamber 124 is shown, it is contemplated that the system 100 may include a plurality of surface protection process chambers. The surface protection process chamber 124 could be lamp-heated in an example where nitridation is the surface protection operation, or could be resistively heated if the surface protection operation includes forming a Ti-containing capping layer. In one example, the system 100 includes one or more of: a first surface protection process chamber 124 configured as a plasma chamber to perform one or more operations including SiN capping, Si capping, or nitridation of the metal-silicide film or metal-germanide film; and/or a second surface protection process chamber 124 that is configured as a plasma chamber capable of forming a Ti or TiN cap. The one or more surface protection process chambers 124 can include a third surface protection process chamber 124 configured to perform nitridation on the metal-silicide film or on the metal-germanide film and to form a Ti or a TiN cap. In one example, the one or more surface protection process chambers 124 include a fourth surface protection process chamber 124 configured to perform nitridation without forming a cap and a fifth surface protection process chamber 124 configured to form an Si cap on the metal-silicide or metal-germanide film.

The system 100 includes one or more sensors that monitor conditions and/or properties of one or more aspects of the system, such as the transfer volume 118 of the transfer chamber 112. The system 100 includes one or more modules 190 (one is shown) having one or more sensors 191a-191d (four are shown). The module 190 having the sensors 191a-191d is disposed in the transfer volume 118 of the transfer chamber 112. The module 190 having the sensors 191a-191d may be attached to the transfer chamber 112, such as attached to an inner surface of the transfer chamber 112. At least one of the sensors 191a-191d is configured to detect, monitor, and/or measure contaminants, and concentrations thereof, in the transfer volume 118, such as while the central transfer robot 116 transfers substrates. In one example, the one or more sensors 191a-191d include one or more in-situ metrology sensors. At least one of the sensors 191a-191d is configured to detect, monitor, and/or measure conditions and/or properties of the substrates processed in the system 100, such as while the substrates are being transferred by the central transfer robot 116. In one example, the one or more sensors 191a-191d include one or more on-wafer spectroscopy sensors, and/or one or more contaminant sensors. In one example, the one or more sensors 191a-191d include one or more oxygen sensors, one or more water vapor sensors, one or more X-ray fluorescence spectroscopy (XRF) sensors, and/or one or more X-ray photoelectron spectroscopy (XPS) sensors. The plurality of instructions executed by the controller 120 includes instructions that instruct the one or more sensors 191a-191d to detect, monitor, and/or measure contaminants, conditions, and/or properties.

Figure 2:
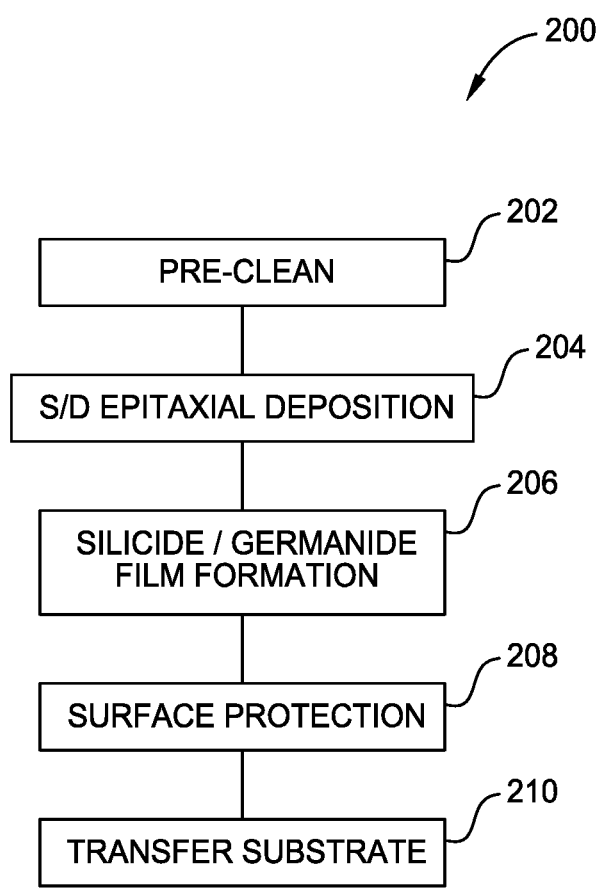
FIG. 2 is a flow chart of a method of forming semiconductor components, according to one implementation of the present disclosure.

Some or all of the process chambers 104, 106, 108, 110, and/or 124 can be used to form MOSFET devices as discussed in the method in FIG. 2 below. FIG. 2 is a method 200 for forming MOSFET devices according to one implementation of the present disclosure. The method 200 is discussed below with respect to the system 100 in FIG. 1. At operation 202, a pre-clean operation occurs in the pre-clean process chamber 108. In one example, a first pre-clean process chamber 108 is used alone at operation 202 to remove native oxide from the substrate. The first pre-clean process chamber 108 can use hydrogen, or an $NF_3/NH_3$ mixture of plasma to remove native oxide from the substrate during operation 202. Additionally or alternatively in operation 202, a second pre-clean chamber 108 may be employed. The second pre-clean process chamber 108 uses plasma, such as hydrogen plasma, argon plasma, or hydrogen-argon plasma, to remove residual carbon from the substrate. As discussed above, the residual carbon can be a result of upstream operations such as those involving the use of a hardmask. In one example, at operation 202, the substrate is transferred into the first pre-clean process chamber 108 to first remove native oxide from the substrate then to the second pre-clean chamber to remove residual carbon. In one example and at operation 202, the substrate is transferred into the second pre-clean process chamber 108 to remove the residual carbon and then transferred into the first pre-clean process chamber 108 to remove the native oxide.

In one example and at operation 202, a third pre-clean process chamber 108 is utilized. The first pre-clean process chamber 108 and the third pre-clean process chamber 108 are used together sequentially. In this example, the substrate can be transferred to the first pre-clean process chamber 108 to remove native oxide from the substrate, and then transferred to the third pre-clean process chamber 108 that is configured to use Cl-plasma, or hydrogen-argon plasma to clean the substrate. In one example and at operation 202, the substrate can be transferred to the third pre-clean process chamber 108 to clean the substrate using Cl plasma or hydrogen-argon plasma and then transferred to the first pre-clean process chamber 108 to remove native oxide from the substrate. In one example of the pre-clean operation at operation 202, the first pre-clean process chamber 108, the second pre-clean process chamber 108, and the third pre-clean process chamber 108 are each used in various orders and combinations to remove the native oxide and/or the residual carbon, and to clean the substrate.

At operation 204, an epitaxial deposition of the source and the drain occurs, for example, in a source/drain epitaxial deposition chamber such as the s/d chambers 104 and/or 106 in FIG. 1. In an example where an NMOS device is fabricated in the method 200, at operation 204 the NMOS chamber 106 is used to form the n-type source and the n-type drain. In an example where a PMOS device is fabricated in the method 200, at operation 204, the PMOS chamber 104 is used to form the p-type source and the p-type drain. In one example, operation 204 occurs subsequent to operation 202. In examples for either or both of NMOS and/or PMOS fabrication, the substrate is received at operation 202 with the source and the drain already deposited. In one example where the source and the drain are already deposited, the substrate is pre-cleaned at operation 202 but operation 204 is not executed and the method proceeds to operation 206.

At operation 206, a metal-silicide film or a metal-germanide film is formed on the source and the drain, for example, by using a CVD process. The film formed at operation 206 can be formed using one or more film formation process chambers 110 discussed herein. Once the film is formed at operation 206, the method 200 can proceed to operation 208. However, in one example, prior to the film formation at operation 206, one or more pre-treatments can be executed to promote film formation at operation 206. In one example, the s/d chambers 104, 106 are configured to execute one or more pre-treatments to promote film formation at operation 206. In one example, the one or more pre-treatment operations can be executed as a part of the source/drain formation in the NMOS chamber 106 or the PMOS chamber 104 during operation 204. The one or more pre-treatments can be executed in a sub-operation, subsequent to the source/drain formation at operation 204, but prior to transferring the substrate to the film formation process chamber 110 at operation 206. The pre-treatment operation can occur as a sub-operation after the substrate is transferred to the film formation process chamber 110 as a part of operation 206. The pre-treatment operation(s) executed can include pre-treating the substrate, e.g., the source and the drain, to increase a dopant concentration of the substrate surface and/or to increase the surface roughness of the substrate. In one example, the substrate is received without a source/drain formed and the method 200 does not include the source/drain formation at operation 204. In this example, the substrate is pre-cleaned at operation 202, and then a metal-silicide or metal-germanide film is formed at operation 206 on the substrate adjacent to a channel region of the MOSFET device to be fabricated.

At operation 208, subsequent to formation of the metal-silicide or germanide at operation 206, the substrate surface is capped or passivated in one or more surface protection process chambers 124 (one is shown in FIG. 1, but additional surface protection process chambers 124 are contemplated). For example, at operation 208, the substrate can undergo nitridation to prevent oxidation, or have a cap deposited that includes SiN, Ti, TiN, and/or Si. In one example and at operation 208, a first surface protection process chamber 124 is used for nitridation. In one example and at operation 208, a Si cap is formed on the substrate in either of the first or second surface protection process chambers 124. The one or more surface protection process chambers 124 used at operation 208 can depend on the MOSFET fabrication process. For example, the metal-silicide or metal-germanide film can be formed prior to formation of metal gates, or after the formation of metal gates. In one example, at operation 208, a SiN cap can be formed in the first surface protection process chamber 124 when operation 206 is executed prior to formation of the metal gates. In one example and at operation 208, a Ti or TiN cap layer can be formed in the second surface protection process chamber 124 when operation 206 is executed after formation of the metal gates.

In one example of the method 200, the system 100 is used to pre-clean a substrate at operation 202, and a source and a drain are subsequently formed on the substrate at operation 204. A silicide or germanide film is formed on the source and the drain at operation 206. Subsequently, a surface protection operation is performed at operation 208 and includes nitridation and/or capping with silicon nitride (SiN), titanium (Ti), titanium nitride (TiN), and/or silicon (Si). In one example, as discussed above, the system 100 is configured to receive substrates at operation 202 that include a source and a drain. In such an example, the substrate is pre-cleaned at operation 202, the silicide or germanide film is formed at operation 206, and a surface protection operation is subsequently executed at operation 208. When the substrate is received at operation 202 with the source and the drain already formed, operation 208 can include the use of the surface protection process chamber 124. At operation 210, the substrate can be transferred to another system outside of the system 100, such as the second system 122 illustrated in FIG. 1. The second system 122 can be configured to perform operations including film formation, patterning, and thermal annealing. When the substrate is transferred out of the system 100 and/or towards another system such as the second system 122, the capping or nitridation at operation 208 facilitates protecting the metal-silicide or metal-germanide layer from forming undesirable oxides or defects if the substrate is exposed to potentially contaminating process environments.

One or more sensors, such as the one or more sensors 191a-191d described above, may detect, monitor, and/or measure contaminants, conditions, and/or properties in the method 200. In one example, the one or more sensors 191a-191d detect, monitor and/or measure contaminants, conditions, and/or properties during, before, and/or after the aspects of the operations 202, 204, 206, 208, and/or 210 of the method 200 are performed.

Using the systems and methods discussed herein, a cluster tool includes process chambers arranged around a transfer chamber. The cluster tool can be configured to perform a variety of operations including operations to pre-clean substrates, form the source and the drain, form a metal-silicide film or metal-germanide film on the source and the drain, and/or form a protective layer on the film. By fabricating the film and protecting the film prior to the MOSFET device being transferred to a different system for subsequent operations, the integrity of the film is preserved, promoting the successful formation of subsequent features including contacts.

While the foregoing is directed to embodiments of the present invention, other and further embodiments of the invention may be devised without departing from the basic scope thereof, and the scope thereof is determined by the claims that follow.

What is claimed is:

1. A computer-readable medium including instructions that are configured to cause a system to:
    transfer a substrate from a transfer chamber into a first process chamber;
    execute a pre-clean operation on the substrate in the first process chamber;
    subsequent to the pre-clean operation on the substrate, transfer the substrate from the first process chamber into a second process chamber;
    epitaxially form a source and a drain on the substrate in the second process chamber, wherein the second process chamber is configured to form an epitaxial layer on a substrate surface;
    subsequent to the formation of the source and the drain in the second process chamber, transfer the substrate from the second process chamber into a third process chamber;
    form a metal-silicide layer or a metal-germanide layer on the source and the drain in the third process chamber;
    subsequent to the formation of the metal-silicide layer or the metal-germanide layer source and the drain, transfer the substrate from the third process chamber into fourth process chamber; and
    perform a surface protection operation on the surface of the substrate in the fourth process chamber wherein the surface protection operation caps or passivates the substrate surface using at least one of a nitridation process, deposition of one of a SiN, Ti, TiN, or Si layer, or a combination thereof.

2. The computer-readable medium of claim 1, wherein the instructions are further configured to execute a pre-silicide treatment in the second process chamber prior to the transfer of the substrate to the third process chamber.

3. The computer-readable medium of claim 1, wherein executing the pre-clean operation comprises:
    removing one or more of a native oxide or a residual carbon from the substrate.

4. The computer-readable medium of claim 1, wherein forming the source and the drain on the substrate comprises one or more of: forming an n-type source and an n-type drain, or forming a p-type source and a p-type drain.

5. The computer-readable medium of claim 1, wherein performing the surface protection operation comprises one or more of: forming a capping layer on the source and the drain, or nitriding the source and the drain.

6. The computer-readable medium of claim 1, wherein the instructions are further configured to instruct one or more sensors to measure one or more contaminants in the transfer chamber and/or one or more properties of the substrate.

7. A method of processing a substrate, comprising:
transferring, using a central transfer robot disposed in a transfer volume of a transfer chamber, a substrate into a first process chamber of a plurality of process chambers configured to perform at least one pre-clean operation;
performing the at least one pre-clean operation in the first process chamber;
subsequent to the at least one pre-clean operation, transferring the substrate from the first process chamber, through the transfer volume of the transfer chamber, and into a second process chamber of the plurality of process chambers, the second process chamber being configured to form a source and a drain on the substrate;
forming the source and the drain on the substrate in the second process chamber of the plurality of process chambers;
subsequent to the formation of the source and the drain, transferring the substrate from the second process chamber, through the transfer volume of the transfer chamber, and into a third process chamber of the plurality of process chambers, the third process chamber being configured to form a film on the source and the drain;
forming the film on the source and the drain in the third process chamber;
subsequent to the formation of the source and the drain, transferring the substrate from the third process chamber, through the transfer volume of the transfer chamber, and into a fourth process chamber of the plurality of process chambers, the fourth process chamber being configured to form a protective film on the source and the drain; and
forming the protective film on the source and the drain in the fourth process chamber.

8. The method of claim 7, wherein the film comprises a metal-silicide or a metal-germanide.

9. The method of claim 7, further comprising measuring, using one or more sensors disposed in the transfer volume of the transfer chamber, one or more contaminants in the transfer volume and/or one or more properties of the substrate.

10. The method of claim 7, wherein performing the at least one pre-clean operation comprises:
removing one or more of a native oxide or a residual carbon from the substrate.

11. The method of claim 7, wherein forming the source and the drain on the substrate comprises one or more of:
forming an n-type source and an n-type drain, or forming a p-type source and a p-type drain.

12. The method of claim 7, wherein forming the protective film on the source and the drain comprises one or more of:
forming a capping layer on the source and the drain, or nitriding the source and the drain.

13. A system comprising:
a plurality of process chambers, wherein a first process chamber of the plurality of process chambers is configured for pre-cleaning operations, a second process chamber of the plurality of process chambers is configured for epitaxial deposition operations, and a third process chamber of the plurality of process chambers is configured to perform at least one of a capping layer formation operation or execute a nitridation operation;
a transfer chamber coupled to each process chamber of the plurality of process chambers;
a central transfer robot configured to transfer a substrate among and between the transfer chamber and one or more of the plurality of process chambers; and
a controller configured to execute a plurality of instructions including which process chambers of the plurality of process chambers the substrate is transferred to, operations executed in the process chambers of the plurality of process chambers when the substrate is transferred, and an order in which the substrate is transferred to the process chambers, wherein
the substrate is transferred from a transfer chamber into the first process chamber for a pre-clean operation;
the pre-clean operation is performed on the substrate in the first process chamber; and
subsequent to the pre-clean operation, the substrate is transferred from the first process chamber into the third process chamber wherein a doped epitaxy layer is formed on the substrate.

14. The system of claim 13, wherein the substrate is transferred using the central transfer robot to one or more process chambers using the plurality of instructions.

15. The system of claim 13, wherein the plurality of process chambers comprises a fourth process chamber configured to form a film on a source and a drain.

16. The system of claim 13, further comprising one or more sensors that are configured to measure at least one of one or more contaminants in the transfer chamber or one or more properties of the substrate.

17. The system of claim 16, wherein the one or more sensors comprise:
one or more sensors configured to measure one or more contaminants in the transfer chamber; and
one or more sensors configured to measure one or more properties of the substrate.

18. The system of claim 17, wherein the plurality of instructions that the controller is configured to execute comprise instructions that instruct:
the one or more sensors configured to measure one or more contaminants to measure a concentration of one or more contaminants in the transfer chamber; and
the one or more sensors configured to measure one or more properties to measure one or more properties of the substrate.

19. The system of claim 16, wherein the one or more sensors configured to measure one or more contaminants in the transfer chamber comprise at least one of one or more oxygen sensors or one or more water vapor sensors.

20. The system of claim 16, wherein the one or more sensors configured to measure one or more properties of the substrate comprise at least one of:
one or more XRF sensors or one or more XPS sensors.

* * * * *